US009685272B2

(12) United States Patent
Ahn et al.

(10) Patent No.: US 9,685,272 B2
(45) Date of Patent: Jun. 20, 2017

(54) MULTILAYER CERAMIC CAPACITOR HAVING MULTILAYER EXTERNAL ELECTRODES AND BOARD HAVING THE SAME

(71) Applicant: SAMSUNG ELECTRO-MECHANICS CO., LTD., Suwon-Si, Gyeonggi-Do (KR)

(72) Inventors: Young Ghyu Ahn, Suwon-Si (KR); Hyun Tae Kim, Suwon-Si (KR); Kyo Kwang Lee, Suwon-Si (KR); Jin Kim, Suwon-Si (KR); Byoung Hwa Lee, Suwon-Si (KR); Hwi Geun Im, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/754,282

(22) Filed: Jun. 29, 2015

(65) Prior Publication Data

US 2015/0318114 A1    Nov. 5, 2015

Related U.S. Application Data

(63) Continuation of application No. 14/601,724, filed on Jan. 21, 2015.

(30) Foreign Application Priority Data

Feb. 27, 2014  (KR) .................. 10-2014-0023639
Oct. 22, 2014  (KR) .................. 10-2014-0143390

(51) Int. Cl.
*H01G 4/30*      (2006.01)
*H01G 4/228*     (2006.01)
(Continued)

(52) U.S. Cl.
CPC .............. *H01G 4/30* (2013.01); *H01G 2/065* (2013.01); *H01G 4/012* (2013.01); *H01G 4/12* (2013.01);
(Continued)

(58) Field of Classification Search
CPC ........ H01G 4/30; H01G 4/232; H01G 4/2325; H01G 4/228; H01G 2/065; H01G 4/12;
(Continued)

(56) References Cited

U.S. PATENT DOCUMENTS 4,590,537 A    5/1986  Sakamoto
4,811,162 A    3/1989  Maher et al.
(Continued)

FOREIGN PATENT DOCUMENTS

CN    1261457 A     7/2000
CN    101241800 A   8/2008
(Continued)

OTHER PUBLICATIONS

Japanese Office Action issued in Japanese Application No. 2015-007866, dated Feb. 2, 2016, with English Translation.
(Continued)

*Primary Examiner* — David M Sinclair
(74) *Attorney, Agent, or Firm* — McDermott Will & Emery LLP

(57) ABSTRACT

A multilayer ceramic capacitor and a board having the same are provided. The multilayer ceramic capacitor includes three external electrodes including a conductive layer, a nickel plating layer, and a tin plating layer sequentially stacked on a mounting surface of the ceramic body, and spaced apart from each other. When an outermost portion of a lead-out portion of an internal electrode exposed to the mounting surface is P, a total thickness of the conductive layer, the nickel plating layer, and the tin plating layer in a
(Continued)

normal line direction of the conductive layer from P is a, a thickness of the conductive layer in the normal line direction of the conductive layer from P is b, and a sum of pore heights of pores existing in the conductive layer in the normal line direction of the conductive layer from P is $b_p$, $(b-b_p)/a$ satisfies $0.264 \leq (b-b_p)/a \leq 0.638$.

18 Claims, 17 Drawing Sheets

(51) Int. Cl.
  *H01G 2/06* (2006.01)
  *H01G 4/012* (2006.01)
  *H01G 4/12* (2006.01)
  *H05K 1/18* (2006.01)
  *H05K 1/11* (2006.01)
  *H01G 4/232* (2006.01)

(52) U.S. Cl.
  CPC ............ *H01G 4/228* (2013.01); *H01G 4/232* (2013.01); *H01G 4/2325* (2013.01); *H05K 1/111* (2013.01); *H05K 1/181* (2013.01); *H05K 2201/10015* (2013.01); *Y02P 70/611* (2015.11)

(58) Field of Classification Search
  CPC .................. H01G 4/012; H05K 1/181; H05K 2201/10015
  See application file for complete search history.

(56) References Cited

U.S. PATENT DOCUMENTS

| | | | |
|---|---|---|---|
| 5,963,416 A | 10/1999 | Honda et al. | |
| 7,920,370 B2 | 4/2011 | Lee et al. | |
| 8,184,425 B2* | 5/2012 | Lee | H01G 4/228 361/303 |
| 8,630,080 B2 | 1/2014 | Iwanaga et al. | |
| 2001/0017420 A1* | 8/2001 | Iwao | H01F 17/0013 257/758 |
| 2003/0007314 A1* | 1/2003 | Sanada | H01G 4/248 361/306.3 |
| 2006/0193103 A1* | 8/2006 | Yoshii | H01G 4/008 361/306.3 |
| 2008/0186652 A1 | 8/2008 | Lee et al. | |
| 2009/0086406 A1* | 4/2009 | Lee | H01G 4/228 361/306.3 |
| 2009/0268372 A1 | 10/2009 | Ogawa et al. | |
| 2010/0206624 A1 | 8/2010 | Feichtinger | |
| 2011/0141658 A1* | 6/2011 | Na | H01G 4/12 361/321.2 |
| 2011/0157767 A1* | 6/2011 | Hur | H01G 4/008 361/305 |
| 2012/0243143 A1* | 9/2012 | Iwanaga | H01G 4/005 361/301.1 |
| 2014/0153155 A1 | 6/2014 | Fujii et al. | |
| 2015/0243438 A1* | 8/2015 | Ahn | H01G 4/012 174/258 |
| 2015/0318114 A1 | 11/2015 | Ahn et al. | |

FOREIGN PATENT DOCUMENTS

| | | |
|---|---|---|
| CN | 102693835 A | 9/2012 |
| JP | 50-48230 U | 4/1985 |
| JP | 2-150010 A | 6/1990 |
| JP | 05-003132 A | 1/1993 |
| JP | 2000-208361 A | 7/2000 |
| JP | 2000-331866 A | 11/2000 |
| JP | 2001-250740 A | 9/2001 |
| JP | 2002164257 A * | 6/2002 |
| JP | 2003-217969 A | 7/2003 |
| JP | 2005-216987 A | 8/2005 |
| JP | 2007-013215 A | 1/2007 |
| JP | 2009-021512 A | 1/2009 |
| JP | 2010-245095 A | 10/2010 |
| JP | 2010-539722 A | 12/2010 |
| JP | 2011-253952 A | 12/2011 |
| JP | 2012-033621 A | 2/2012 |
| JP | 2012-204441 A | 10/2012 |
| JP | 5-343259 B2 | 11/2013 |
| JP | 2014-017470 A | 1/2014 |
| KR | 10-0920614 B1 | 10/2009 |
| KR | 10-2009-0117686 A | 11/2009 |
| WO | 99/00807 A1 | 1/1999 |

OTHER PUBLICATIONS

Japanese Office Action issued in Japanese Application No. 2015-007866 dated Jul. 12, 2016, with English Translation.
U.S. Office Action issued in U.S. Appl. No. 14/601,724, dated Jul. 15, 2016.
Final Office Action U.S. Appl. No. 14/601,724 dated Dec. 30, 2016.
Advisory Action U.S. Appl. No. 14/601,724 dated Mar. 9, 2017.
Non-Final Office Action U.S. Appl. No. 14/601,724 dated Apr. 11, 2017.
First Office Action Chinese Patent Application No. 201510058083.4 dated Apr. 18, 2017 with full English translation.

\* cited by examiner

MULTILAYER CERAMIC CAPACITOR HAVING MULTILAYER EXTERNAL ELECTRODES AND BOARD HAVING THE SAME

CROSS-REFERENCE TO RELATED APPLICATION

This application is a continuation of U.S. application Ser. No. 14/601,724, filed on Jan. 21, 2015, which claims the priority and benefit of Korean Patent Application No. 10-2014-0023639 filed on Feb. 27, 2014 and Korean Patent Application No. 10-2014-0143390 filed on Oct. 22, 2014, with the Korean Intellectual Property Office, the disclosures of which are incorporated herein by reference.

BACKGROUND

The present disclosure relates to a multilayer ceramic capacitor and a board having the same.

As electronic components using a ceramic material, capacitors, inductors, a piezoelectric material, varistors, thermistors, and the like may be used.

Among these ceramic electronic components, multilayer ceramic capacitors (MLCCs) have advantages such as a small size, high capacitance, ease of mounting, and the like.

The multilayer ceramic capacitors are chip-shaped condensers mounted on boards of several electronic products such as computers, personal digital assistants (PDAs), cellular phones, and the like, to serve to be charged with electricity or discharge electricity, and have various sizes and multilayer forms according to the use and capacitance thereof.

Particularly, in accordance with the recent trend toward the miniaturization of electronic products, micro-miniaturized and super high capacitance multilayer ceramic capacitors have been required in electronic products.

Therefore, multilayer ceramic capacitors in which thicknesses of dielectric layers and internal electrodes are decreased for implementations of micro-miniaturized electronic products and a number of dielectric layers are stacked for implementations of super high capacitance electronic products have been manufactured.

In this case, a plating solution may infiltrate through a portion of an external electrode having a thin thickness and a low degree of densification on a surface of the capacitor to which the internal electrode is exposed, such that moisture resistance reliability, high-temperature load reliability, or the like, may be deteriorated.

SUMMARY

Some embodiments in the present disclosure may provide a multilayer ceramic capacitor capable of preventing deterioration of reliability while maintaining low equivalent series inductance (ESL) characteristics, and a board having the same.

According to some embodiments in the present disclosure, a multilayer ceramic capacitor may include: three external electrodes including a conductive layer, a nickel plating layer, and a tin plating layer sequentially stacked on a mounting surface of the ceramic body, and disposed to be spaced apart from each other, wherein when an outermost portion of a lead-out portion of an internal electrode exposed to the mounting surface of the ceramic body is defined as P, a total thickness of the conductive layer, the nickel plating layer, and the tinplating layer in a normal line direction of the conductive layer from P is defined as a, a thickness of the conductive layer in the normal line direction of the conductive layer from P is defined as b, and a sum of pore heights of pores existing in the conductive layer in the normal line direction of the conductive layer from P is defined as $b_p$, $(b-b_p)/a$ may satisfy $0.264 \leq (b-b_p)/a \leq 0.638$.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
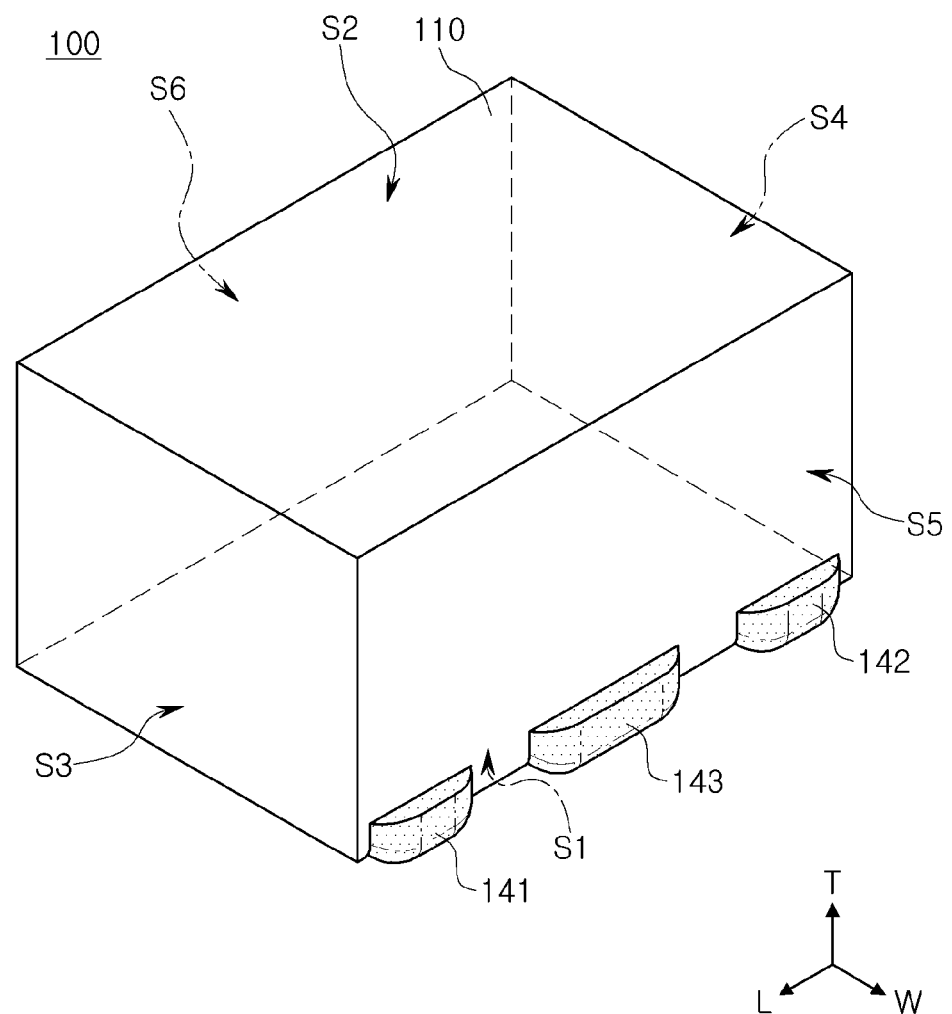
FIG. 1 is a perspective view schematically illustrating a multilayer ceramic capacitor according to an exemplary embodiment in the present disclosure in a state in which the multilayer ceramic capacitor is overturned.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A multilayer ceramic capacitor according to an exemplary embodiment in the present disclosure may include: a ceramic body including a plurality of dielectric layers stacked therein; a plurality of first and second internal electrodes alternately disposed in the ceramic body, each first and second internal electrodes interposed between the respective dielectric layer, and the first and second internal electrodes including first and second body portions overlapped with each other and first and second lead-out portions extended from the first and second body portions to be exposed to mounting surface of the ceramic body, respectively; and first and second external electrodes formed on the one surface of the ceramic body to be electrically connected to the first and second lead-out portions, respectively. In the first and second external electrodes, a conductive layer, a nickel (Ni) plating layer, and a tin (Sn) plating layer are sequentially stacked on the mounting surface of the ceramic body, and when an outermost portion of one of the first and second lead-out portions exposed to the mounting surface of the ceramic body is P, a total thickness of the conductive layer, the nickel plating layer, and the tin plating layer in a normal line direction of the conductive layer from P is a, a thickness of the conductive layer in the normal line direction of the conductive layer from P is b, and a sum of pore heights of pores existing in the conductive layer in the normal line direction of the conductive layer from P is $b_p$, $(b-b_p)/a$ satisfies $0.264 \leq (b-b_p)/a \leq 0.638$.

In addition, when a thickness of the nickel plating layer in the normal line direction of the conductive layer from P is c, b/c satisfies $0.930 \leq b/c \leq 5.391$.

Directions of a hexahedron will be defined in order to clearly describe exemplary embodiments in the present disclosure. L, W and T shown in the accompanying drawings refer to a length direction, a width direction, and a thickness direction, respectively.

Multilayer Ceramic Capacitor

Figure 2:
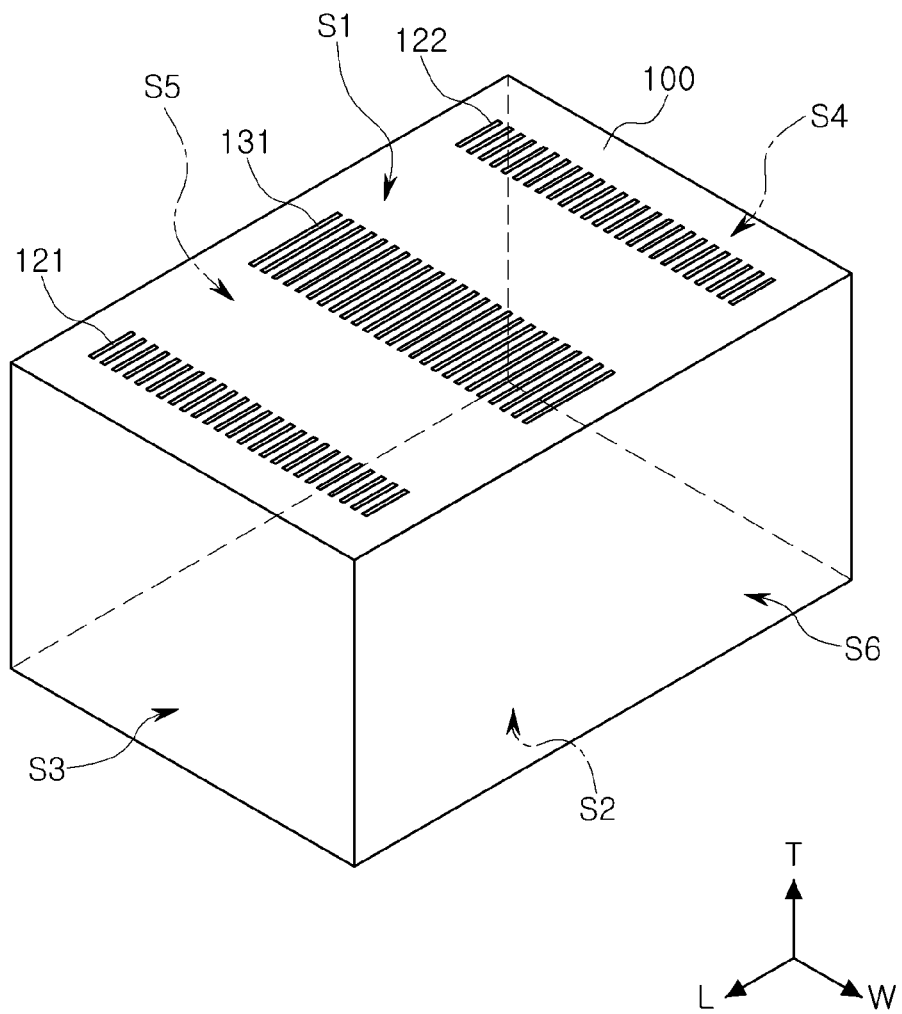
FIG. 2 is a perspective view illustrating a ceramic body of the multilayer ceramic capacitor of FIG. 1 in a state in which the ceramic body is overturned.
Figure 3:
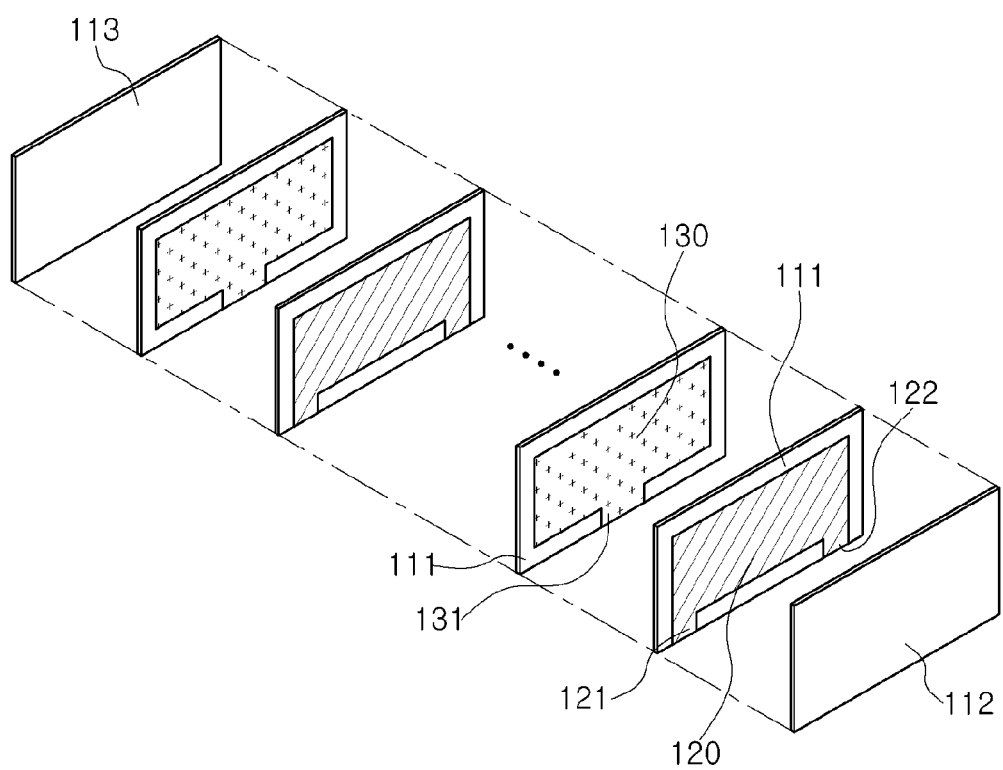
FIG. 3 is an exploded perspective view illustrating the multilayer ceramic capacitor of FIG. 1 in a state in which external electrodes thereof are omitted.
Figure 4:
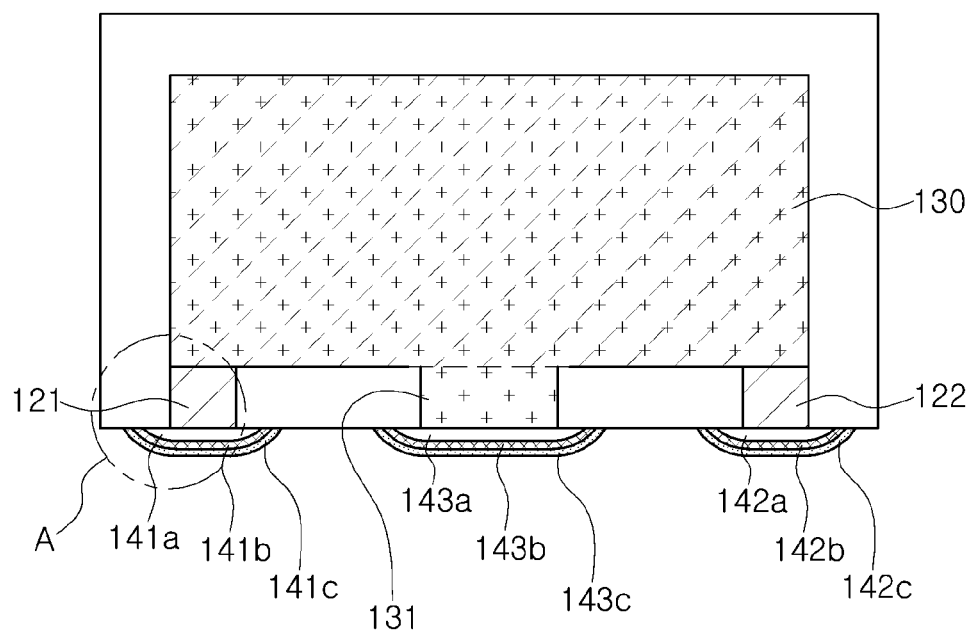
FIG. 4 is a cross-sectional view illustrating the multilayer ceramic capacitor of FIG. 1.

FIG. 1 is a perspective view schematically illustrating a multilayer ceramic capacitor according to an exemplary embodiment in the present disclosure in a state in which the multilayer ceramic capacitor is overturned, FIG. 2 is a perspective view illustrating a ceramic body of the multilayer ceramic capacitor of FIG. 1 in a state in which the ceramic body is overturned, FIG. 3 is an exploded perspective view illustrating the multilayer ceramic capacitor of FIG. 1 in a state in which external electrodes thereof are omitted, and FIG. 4 is a cross-sectional view illustrating the multilayer ceramic capacitor of FIG. 1.

Referring to FIGS. 1 through 4, the multilayer ceramic capacitor 100 according to the exemplary embodiment in the present disclosure may include a ceramic body 110 in which a plurality of dielectric layers 111 are stacked in the width direction of the ceramic body, an active layer including a plurality of first and second internal electrodes 120 and 130, and first to third external electrodes 141 to 143.

The multilayer ceramic capacitor 100 according to the exemplary embodiment in the present disclosure may be considered as a so-called 3-terminal capacitor having a total of 3 external terminals.

The ceramic body 110 may be formed by stacking the plurality of dielectric layers 111 in the width direction and then sintering the stacked dielectric layers 111, and a shape thereof is not particularly limited, but may be a hexahedral shape as shown in the accompanying drawings.

The ceramic body 110 may include first and second surfaces S1 and S2 opposing each other in the thickness direction, fifth and sixth surfaces S5 and S6 connecting the first and second surfaces S1 and S2 to each other and opposing each other in the width direction, and third and fourth surfaces S3 and S4 opposing each other in the length direction.

Hereinafter, in the exemplary embodiment of the present disclosure, a mounting surface of the multilayer ceramic capacitor 100 may be the first surface S1 of the ceramic body 110.

However, a shape and a dimension of the ceramic body 110 and the number of stacked dielectric layers 111 are not limited to those of the exemplary embodiment in the present disclosure shown in the accompanying drawings.

The plurality of dielectric layers 111 configuring the ceramic body 110 may be in a sintered state. Adjacent dielectric layers 111 may be integrated so as to be difficult to confirm a boundary therebetween without using a scanning electron microscope (SEM).

This ceramic body 110 may include the active layer including the plurality of internal electrodes as a part contributing to forming capacitance of the capacitor and the cover layers 112 and 113 formed on both sides of the active layer in the width direction as margin parts.

The active layer may be formed by alternately stacking the plurality of first and second internal electrodes 120 and 130 in the width direction with the respective dielectric layer 111 interposed therebetween.

In this case, a thickness of the dielectric layer 111 may be optionally changed according to the capacitance design of the multilayer ceramic capacitor 100, but a thickness of a single layer may be 0.4 to 3.0 μm after sintering. However, the present disclosure is not limited thereto.

Further, the dielectric layer 111 may contain ceramic powder having high permittivity, for example, barium titanate ($BaTiO_3$)-based powder or strontium titanate ($SrTiO_3$)-based powder, but the present disclosure is not limited thereto as long as sufficient capacitance may be obtained.

In addition, when necessary, a ceramic additive, an organic solvent, a plasticizer, a binder, a dispersant, and the like, may be further added to the dielectric layer 111 together with the ceramic powder.

In this case, an average particle size of ceramic powder particles used to form the dielectric layer 111 is not particularly limited and may be adjusted according to the purpose of the present disclosure. For example, the average particle size of the ceramic powder particle may be controlled to be equal to 400 nm or less, but the present disclosure is not limited thereto.

The cover layers 112 and 113 may have the same material and configuration as those of the dielectric layer 111 except that internal electrodes are not included therein.

In addition, the cover layers 112 and 113 may be formed by further stacking a single dielectric layer, or two or more dielectric layers, on both sides of the active layer in the width direction, respectively, and may serve to prevent the first and second internal electrodes 120 and 130 from being damaged due to physical or chemical stress.

The first and second internal electrodes 120 and 130 having different polarities may be formed in the ceramic body 110 and disposed so as to face each other with the respective dielectric layer 111 interposed therebetween.

In this case, the first and second internal electrodes 120 and 130 may be electrically insulated from each other by the dielectric layer 111 disposed therebetween.

In addition, the first and second internal electrodes 120 and 130 may be disposed to be spaced apart from the third and fourth surfaces S3 and S4 of the ceramic body 110 in the length direction thereof.

The first and second internal electrodes 120 and 130 may include a body portion contributing to the formation of capacitance through overlapped portions of internal electrodes adjacent to each other and a lead-out portion as a portion partially extended from the body portion and exposed to the outer surface of the ceramic body 110.

The lead-out portion may have, for example, a length shorter than that of the body portion, but is not particularly limited thereto.

Further, a thickness of the first and second internal electrodes 120 and 130 may be determined according to the use thereof. For example, the thickness may be determined to be in a range of 0.2 to 1.0 μm in consideration of a size of the ceramic body 110, but the present disclosure is not limited thereto.

In addition, a material forming the first and second internal electrodes 120 and 130 is not particularly limited. For example, the first and second internal electrodes 120 and 130 may be formed using a conductive paste containing one or more of a noble metal such as palladium (Pd), a palladium-silver (Pd—Ag) alloy, or the like, nickel (Ni), and copper (Cu), or the like.

Further, as a printing method of the conductive paste, a screen printing method, a gravure printing method, or the like, may be used, but the present disclosure is not limited thereto.

In the exemplary embodiment of the present disclosure, the first internal electrode 120 may have first and second lead-out portions 121 and 122 spaced apart from each other in the length direction of the ceramic body and exposed to the first surface S1 of the ceramic body 110 and may be spaced apart from the third and fourth surfaces S3 and S4 by a predetermined distance.

In addition, the second internal electrode 130 may have a third lead-out portion 131 exposed to the first surface S1 of the ceramic body 110 and formed between the first and second lead-out portions 121 and 122 so as to be spaced apart from the respective first and second lead-out portions 121 and 122 by a predetermined distance, and may be spaced apart from the third and fourth surfaces S3 and S4 by a predetermined distance.

In a general multilayer ceramic electronic component, an external electrode may be disposed on both end surfaces of a ceramic body opposing each other in a length direction of the ceramic body.

However, in this case, at the time of applying an alternating current (AC) voltage to the external electrode, since a current path is relatively long, a current loop may be relatively large, and an intensity of an induced magnetic field may be increased, such that inductance may be increased.

In order to solve this problem, according to an exemplary embodiment in the present disclosure, the first and second external electrodes 141 and 142 may be disposed on the first surface S1 of the ceramic body 110, and the third external electrode 143 may be disposed between the first and second external electrodes 141 and 142 on the first main surface S1 of the ceramic body 110.

In this case, since an interval between the first and second external electrodes 141 and 142 and the third external electrode 143 is relatively short, the current loop may be decreased, such that inductance may be decreased.

The first and second external electrodes 141 and 142 may be formed on the first surface S1 of the ceramic body 110 so as to be spaced apart from each other in the length direction of the ceramic body and contact the first and second lead-out portions 121 and 122, respectively, to thereby be electrically connected thereto.

The third external electrode 143 may be formed on the first surface S1 of the ceramic body 110 so as to be spaced apart from the respective first and second external electrodes 141 and 142 by a predetermined distance and contact the third lead-out portion 131 to thereby be electrically connected thereto.

In addition, the first to third external electrodes 141 to 143 may be electrically connected to the corresponding lead-out portions of the first and second internal electrodes 120 and 130, respectively, in order to form capacitance, and when necessary, the first to third external electrodes 141 to 143 may be extended to portions of the fifth and sixth surfaces S5 and S6 of the ceramic body 110 to form side bands.

In the exemplary embodiment of the present disclosure, the first to third external electrodes 141 to 143 may have a three layer structure and may include first to third conductive layers 141a to 143a contacting the corresponding lead-out portions of the internal electrode, respectively, to thereby be electrically connected thereto, first to third nickel (Ni) plating layers 141b to 143b formed to cover the first to third conductive layers 141a to 143a, respectively, and first to third tin (Sn) plating layers 141c to 143c formed to cover the first to third nickel plating layers 141b to 143b, respectively.

The first to third conductive layers 141a to 143a may be formed using the same conductive material as that of the first and second internal electrodes 120 and 130, but are not limited thereto. For example, the first to third conductive layers 141a to 143a may be formed using powder of a metal such as copper (Cu), silver (Ag), nickel (Ni), or the like, and formed by applying a conductive paste prepared by adding glass frit to this metal powder and then sintering the applied conductive paste.

Figure 5:
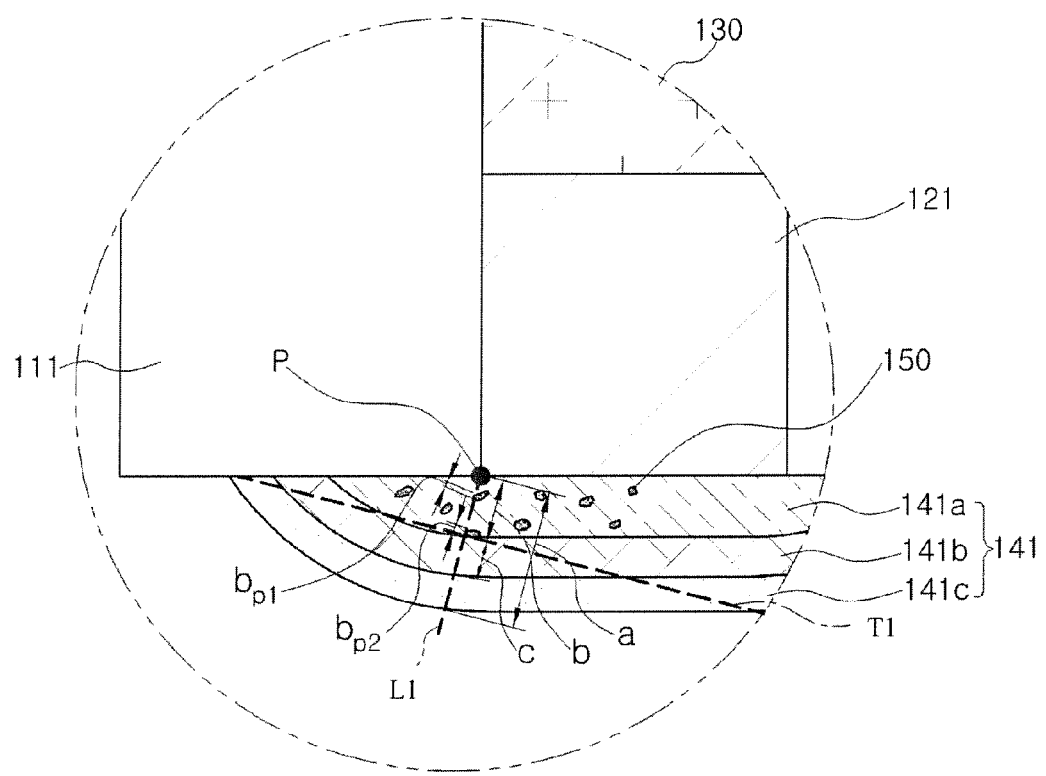
FIG. 5 is an enlarged side cross-sectional view illustrating part A of FIG. 4.

FIG. 5 is an enlarged side cross-sectional view illustrating part A of FIG. 4.

In the exemplary embodiment of the present disclosure, the first lead-out portion 121 and the first external electrode 141 connected to the first lead-out portion 121 are described by way of example, but the present disclosure is not limited thereto. Numerical limitations to be described below may be similarly applied to the second and third lead-out portions and the second and third external electrodes contacting the respective lead-out portions to thereby be electrically connected thereto, and a detailed description thereof will be omitted in order to avoid an overlapping description.

In addition, the numerical limitations may be similarly applied to fourth to sixth lead-out portions to be described below and fourth to sixth external electrodes contacting the respective lead-out portions to thereby be electrically connected thereto.

Referring to FIG. 5, an outermost portion of the first lead-out portion 121 exposed to the first surface S1 of the ceramic body 110 may be defined as P, a total thickness of the first conductive layer 141a, the first nickel plating layer 141b, and the first tin plating layer 141c in a normal line direction of the first conductive layer 141a from P may be defined as a, a thickness of the first conductive layer 141a in the normal line direction of the first conductive layer 141a from P may be defined as b, and a thickness of the first nickel plating layer 141b in the normal line direction of the first conductive layer 141a from P may be defined as c.

Here, the normal line L1 indicates a straight line which passes through P and is perpendicular to a tangent plane T1 at a point on a curved line forming a boundary surface between the first conductive layer and the first nickel plating layer.

In addition, a sum of pore heights $b_{p1}$ and $b_{p2}$ of pores existing in the first conductive layer 141a in the normal line direction of the first conductive layer 141a from P may be defined as $b_p$.

The case in which the number of corresponding pores is two is shown in FIG. 5 and described in the exemplary embodiment of the present disclosure, but the present disclosure is not limited thereto. The number of pores existing in the first conductive layer 141a in the normal line direction of the first conductive layer 141a from P may be one or three or more in some cases.

In the exemplary embodiment of the present disclosure, $(b-b_p)/a$, which is a ratio of a real thickness ($b-b_p$, a thickness of only a metal portion) except for thickness $b_p$ of the pores from the thickness b of the conductive layer directly connected to the internal electrode to the thickness a of the entire external electrode, may satisfy $0.264 \leq (b-b_p)/a \leq 0.638$.

Since the lower the ratio $(b-b_p)/a$ is, the smaller the real thickness of the external electrode is, the possibility that a plating solution will infiltrate into the internal electrode at the time of plating, for example, forming the nickel plating layer, may be increased, thereby increasing the possibility of deterioration in reliability.

In addition, b/c, a ratio of the thickness b of the conductive layer directly connected to the internal electrode to the thickness c of the nickel plating layer may satisfy $0.930 \leq b/c \leq 5.391$.

Since the lower the ratio b/c is, the thinner the conductive layer is and the thicker the nickel plating layer is, the possibility that the plating solution will infiltrate into the internal electrode at the time of plating, for example, forming the nickel plating layer, may be increased, thereby increasing the possibility of deterioration in reliability.

Modified Example

Figure 6:
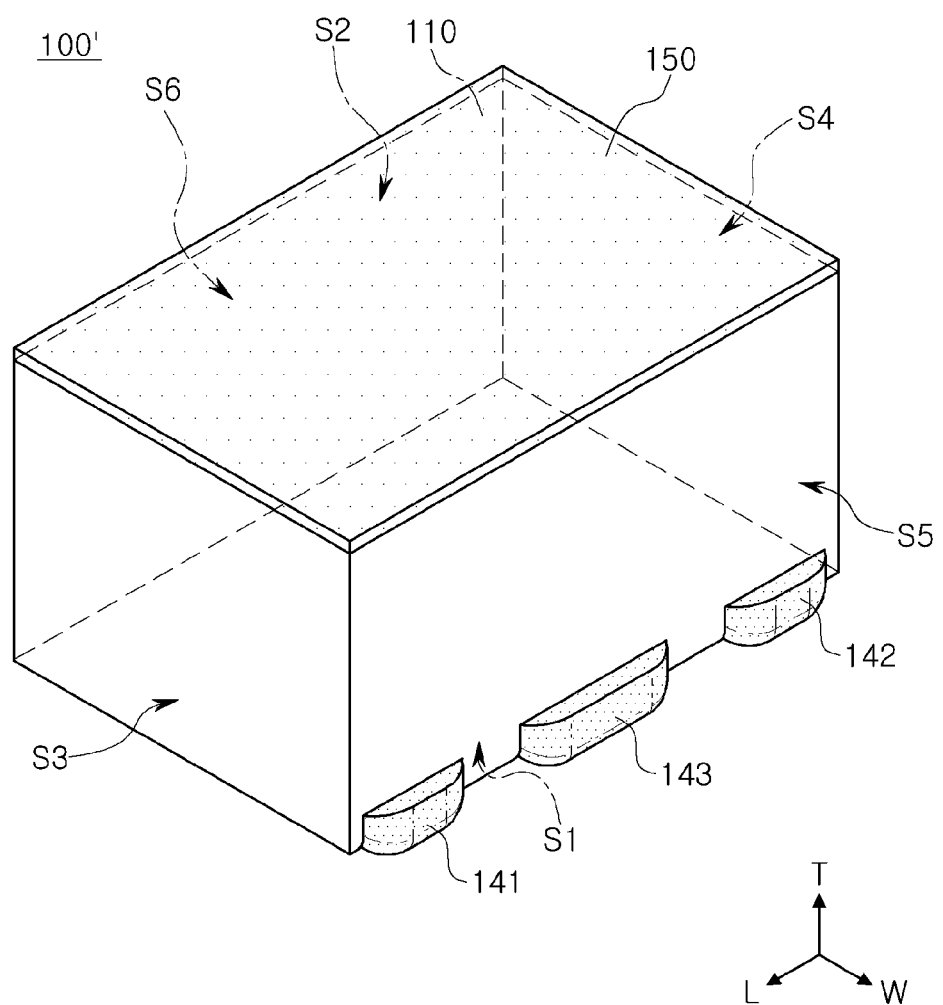
FIG. 6 is a perspective view schematically illustrating a multilayer ceramic capacitor according to another exemplary embodiment in the present disclosure.
Figure 7:
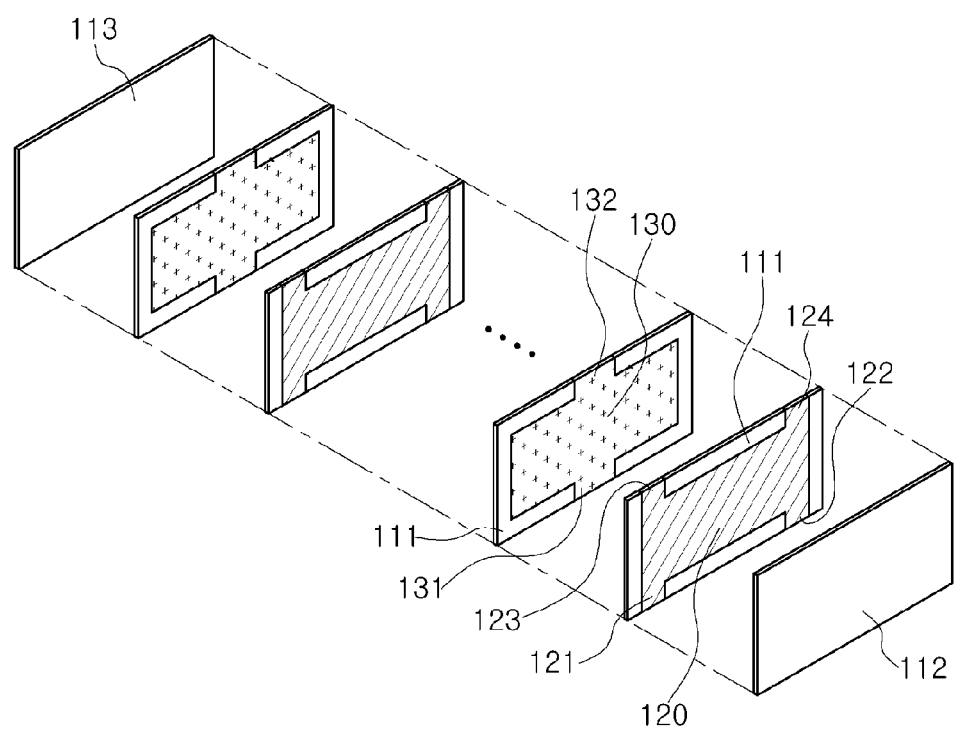
FIG. 7 is an exploded perspective view illustrating the multilayer ceramic capacitor of FIG. 6 in a state in which external electrodes thereof are omitted.
Figure 8:
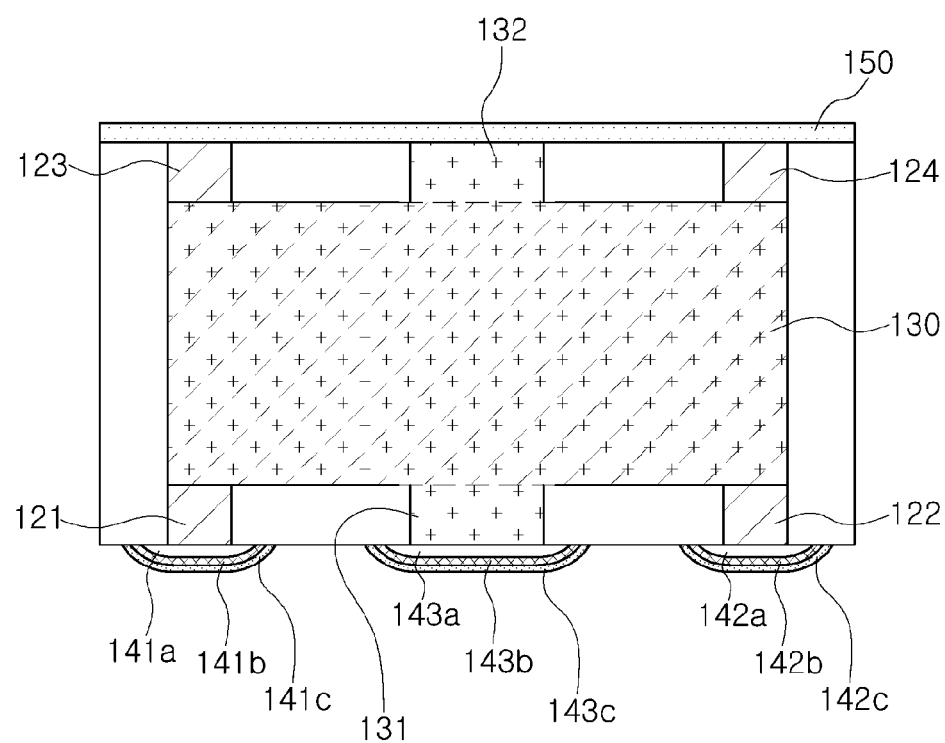
FIG. 8 is a cross-sectional view illustrating the multilayer ceramic capacitor of FIG. 6.

FIG. 6 is a perspective view schematically illustrating a multilayer ceramic capacitor according to another exemplary embodiment in the present disclosure, FIG. 7 is an exploded perspective view illustrating the multilayer ceramic capacitor of FIG. 6 in a state in which external electrodes thereof are omitted, and FIG. 8 is a cross-sectional view illustrating the multilayer ceramic capacitor of FIG. 6.

Here, since a structure of a ceramic body 110 is the same as that in the above-mentioned exemplary embodiment, a detailed description thereof will be omitted in order to avoid an overlapped description, and first and second internal electrodes 120 and 130 having different structures from those in the above-mentioned exemplary embodiment and an insulating layer 150 will be described in detail.

Referring to FIGS. 6 through 8, in a multilayer ceramic capacitor 100' according to another exemplary embodiment in the present disclosure, the insulating layer 150 may be disposed on the second surface S2 opposing the mounting surface of the ceramic body 110.

The first internal electrode 120 may have fourth and fifth lead-out portions 123 and 124 exposed to the second surface S2 of the ceramic body 110 to contact the insulating layer 150 formed on the second surface S2 of the ceramic body 110.

The second internal electrode 130 may have a sixth lead-out portion 132 disposed between the fourth and fifth lead-out portions 123 and 124 and exposed to the second surface S2 of the ceramic body 110 to contact the insulating layer 150.

Figure 9:
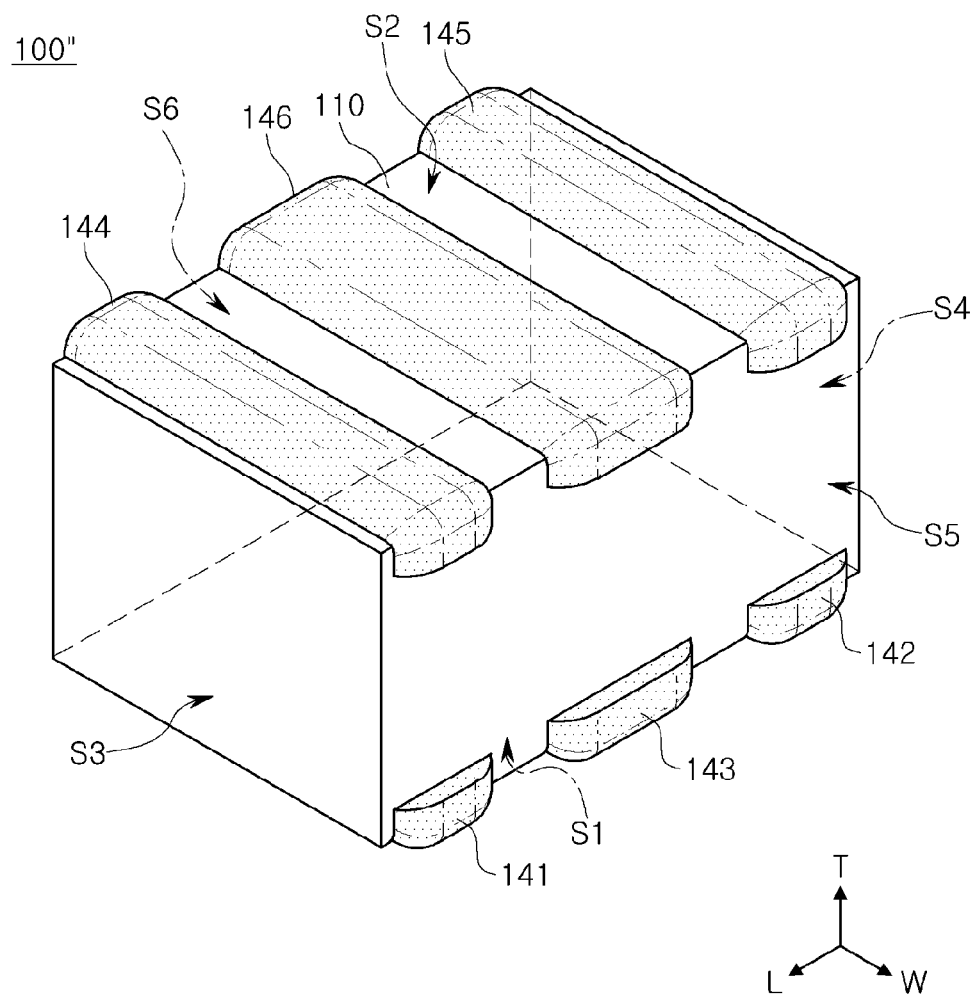
FIG. 9 is a perspective view schematically illustrating a multilayer ceramic capacitor according to another exemplary embodiment in the present disclosure.
Figure 10:
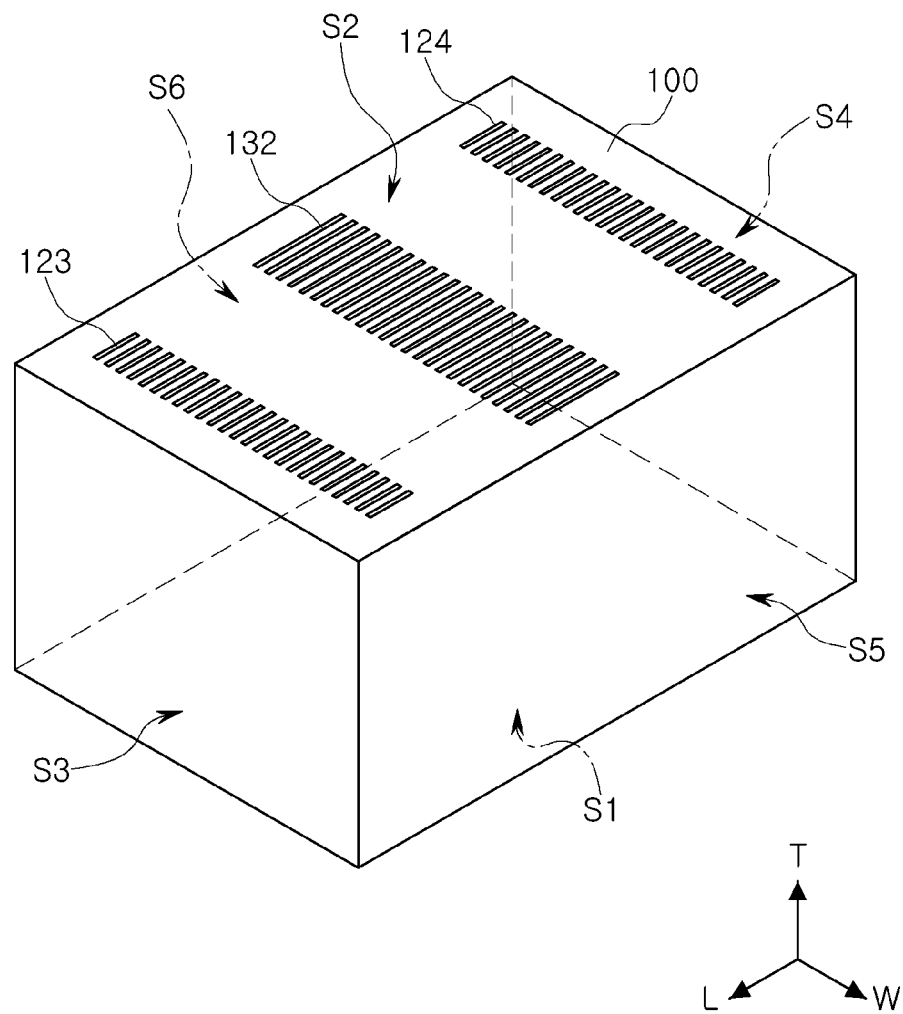
FIG. 10 is a perspective view illustrating a ceramic body of the multilayer ceramic capacitor of FIG. 9.
Figure 11:
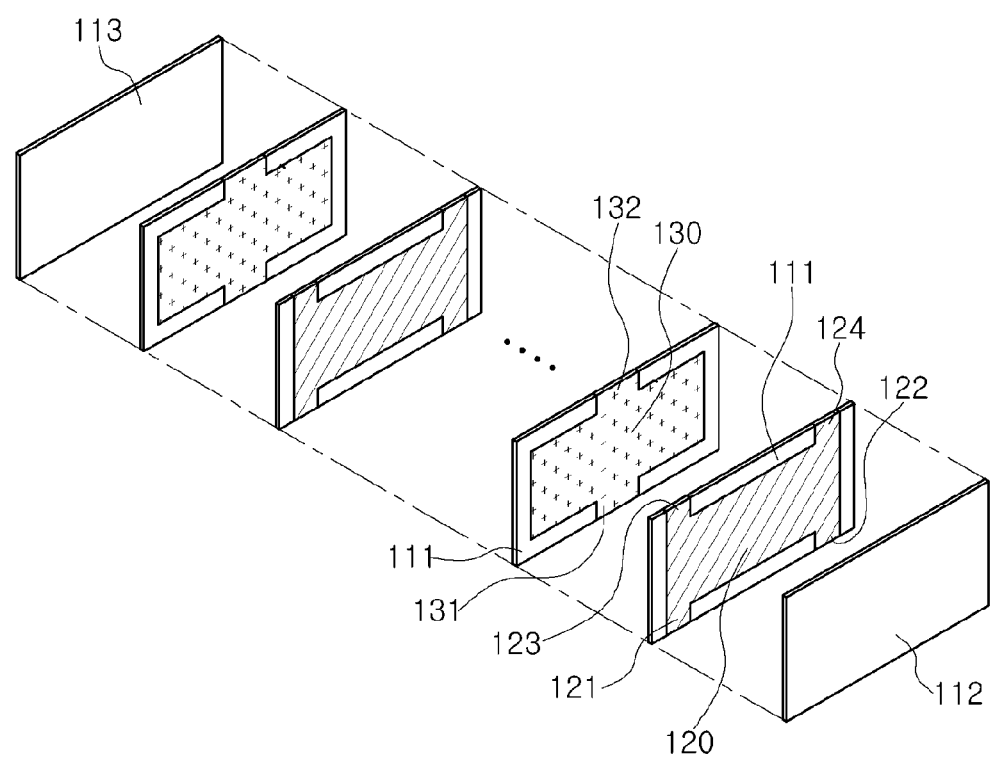
FIG. 11 is an exploded perspective view illustrating the multilayer ceramic capacitor of FIG. 9 in a state in which external electrodes thereof are omitted.
Figure 12:
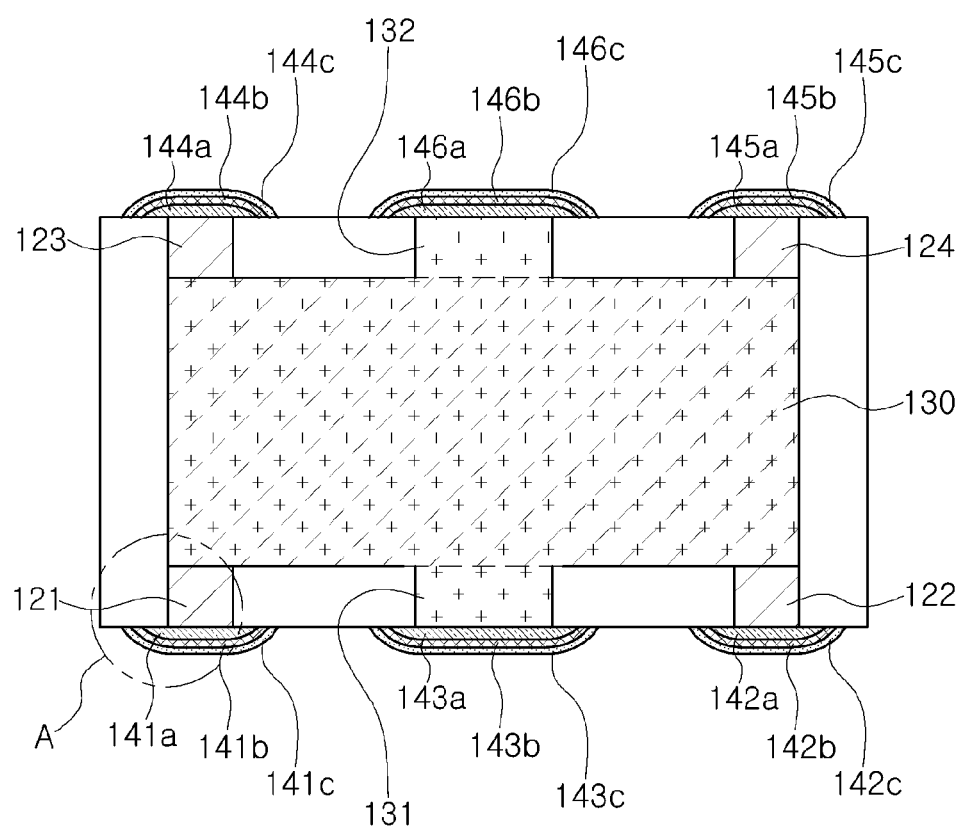
FIG. 12 is a cross-sectional view illustrating the multilayer ceramic capacitor of FIG. 9.

FIG. 9 is a perspective view schematically illustrating a multilayer ceramic capacitor according to another exemplary embodiment in the present disclosure, FIG. 10 is a perspective view illustrating a ceramic body of the multilayer ceramic capacitor of FIG. 9, FIG. 11 is an exploded perspective view illustrating the multilayer ceramic capacitor of FIG. 9 in a state in which external electrodes thereof are omitted, and FIG. 12 is a cross-sectional view illustrating the multilayer ceramic capacitor of FIG. 9.

Here, since a structure of a ceramic body 110 is the same as that in the above-mentioned exemplary embodiment, a detailed description thereof will be omitted in order to avoid an overlapped description, and fourth to sixth external electrodes 144 to 146 and first and second internal electrodes 120 and 130 having different structures from those in the above-mentioned exemplary embodiment will be described in detail.

Referring to FIGS. 9 through 12, in a multilayer ceramic capacitor 100" according to the present exemplary embodiment, the fourth to sixth external electrodes 144 to 146 may be disposed on the second surface S2 of the ceramic body 110 to oppose the first to third external electrodes 141 to 143, respectively.

In this case, when necessary, the fourth to sixth external electrodes 144 to 146 may be extended to portions of the fifth and sixth surfaces S5 and S6 in the width direction of the ceramic body 110.

The fourth to sixth external electrodes 144 to 146 may have a three layer structure and may include fourth to sixth conductive layers 144a to 146a contacting corresponding lead-out portions of the internal electrodes to thereby be connected thereto, respectively, fourth to sixth nickel (Ni) plating layers 144b to 146b formed to cover the fourth to sixth conductive layers 144a to 146a, respectively, and fourth to sixth tin (Sn) plating layers 144c to 146c formed to cover the fourth to sixth nickel plating layers 144b to 146b, respectively.

The first internal electrode 120 may have fourth and fifth lead-out portions 123 and 124 exposed to the second surface S2 of the ceramic body 110 to be electrically connected to the fourth and fifth external electrodes 144 and 145 formed on the second surface S2 of the ceramic body 110, respectively.

The second internal electrode 130 may have a sixth lead-out portion 132 disposed between the fourth and fifth lead-out portions 123 and 124 and exposed to the second surface S2 of the ceramic body 110 to be electrically connected to the sixth external electrode 146.

As described above, in the case of forming internal and external structures of the multilayer ceramic capacitor 100" to be vertically symmetric structure, directionality of the capacitor may be removed.

In detail, since the multilayer ceramic capacitor 100" has a vertically symmetric structure, a defect occurring when amounting surface is inversely disposed at the time of mounting the capacitor on a substrate may be prevented.

Therefore, since one of the first and second surfaces S1 and S2 of the multilayer ceramic capacitor 100" may be provided as a mounting surface, at the time of mounting the multilayer ceramic capacitor 100" on a substrate, there is no need to consider a direction of the mounting surface.

Figure 13:
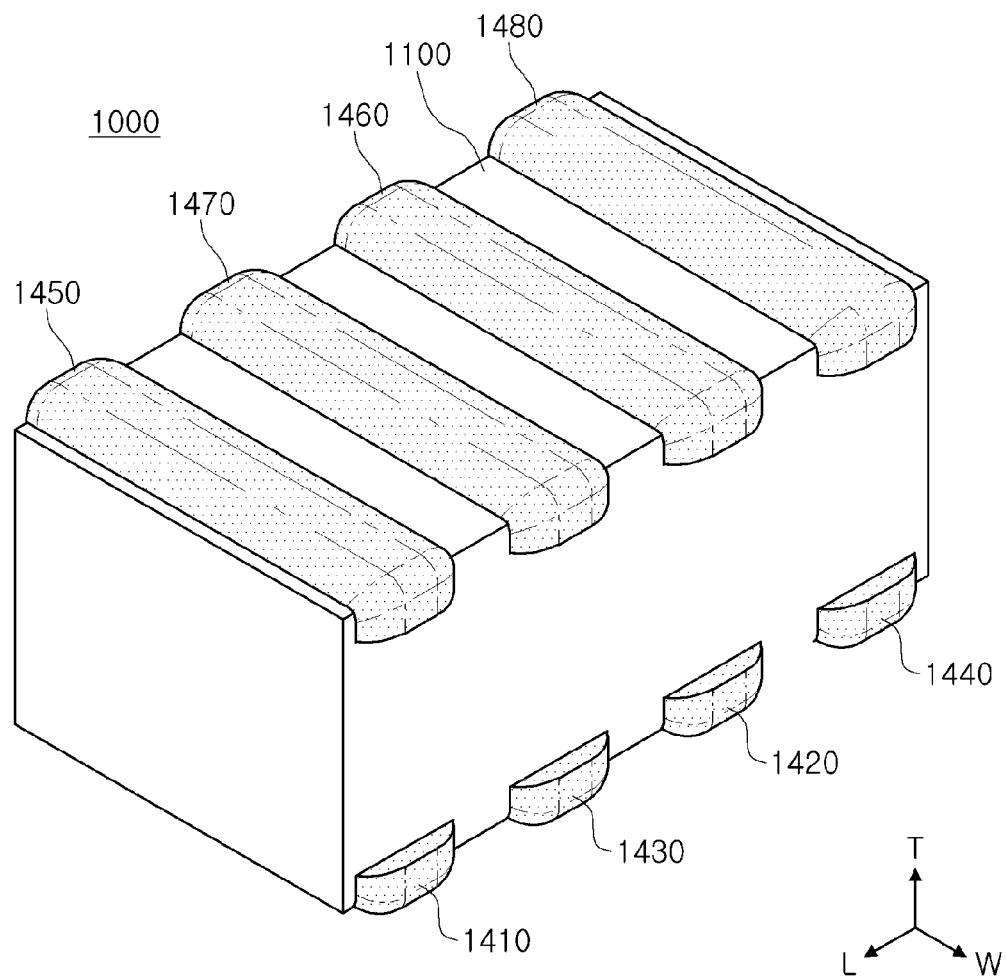
FIG. 13 is a perspective view schematically illustrating a multilayer ceramic capacitor according to another exemplary embodiment in the present disclosure.
Figure 14:
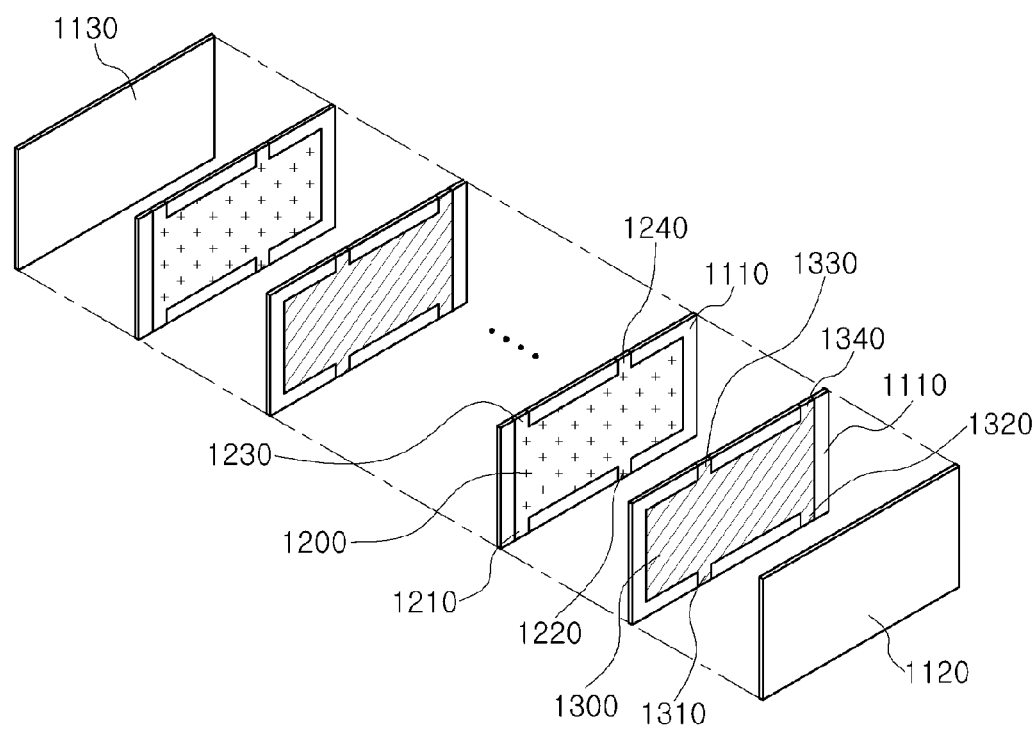
FIG. 14 is an exploded perspective view illustrating the multilayer ceramic capacitor of FIG. 13 in a state in which external electrodes thereof are omitted.
Figure 15:
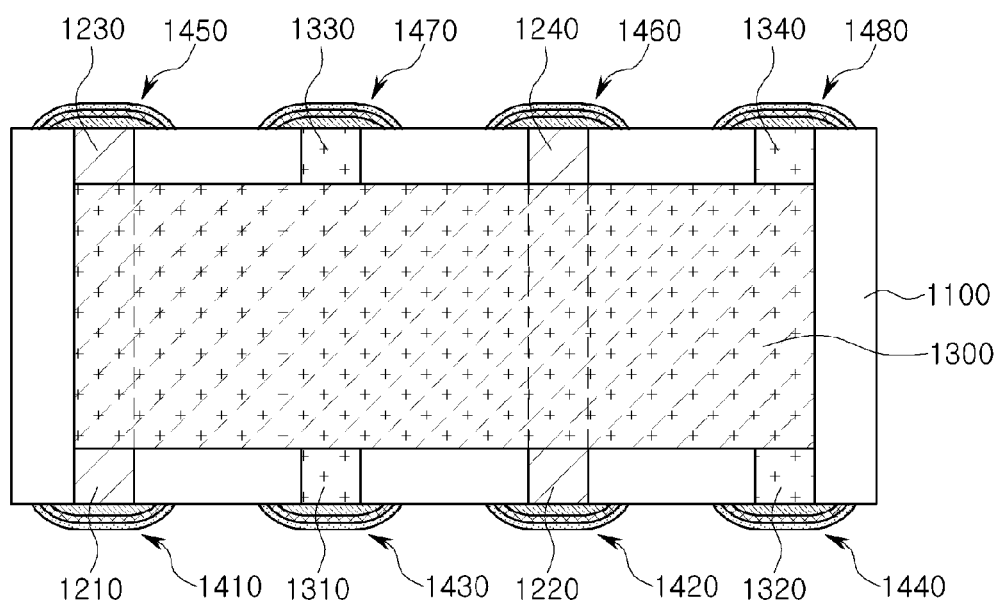
FIG. 15 is a cross-sectional view illustrating the multilayer ceramic capacitor of FIG. 13.

FIG. 13 is a perspective view schematically illustrating a multilayer ceramic capacitor according to another exemplary embodiment in the present disclosure, FIG. 14 is an exploded perspective view illustrating the multilayer ceramic capacitor of FIG. 13 in a state in which external electrodes thereof are omitted, and FIG. 15 is a cross-sectional view illustrating the multilayer ceramic capacitor of FIG. 13.

Referring to FIGS. 13 through 15, in a multilayer ceramic capacitor 1000 according to another exemplary embodiment in the present disclosure, a plurality of first and second internal electrodes 1200 and 1300 may be alternately formed in a ceramic body 1100 with the respective dielectric layer 1110 interposed therebetween. Here, reference numerals 1120 and 1130 indicate cover layers.

The first internal electrode 1200 may have first and second lead-out portions 1210 and 1220 spaced apart from each other in a length direction of the ceramic body and exposed to a first surface S1 of the ceramic body 1100 and may be formed to be spaced apart from third and fourth surfaces S3 and S4.

In addition, the second internal electrode 1300 may have third and fourth lead-out portions 1310 and 1320 exposed to the first surface S1 of the ceramic body 1100 and formed alternately with the first and second lead-out portions 1210 and 1220 in the length direction thereof so as not to be overlapped with each other, and may be spaced apart from the third and fourth surfaces S3 and S4.

First and second external electrodes 1410 and 1420 may be formed on the first surface S1 of the ceramic body 1110 so as to be spaced apart from each other in the length direction of the ceramic body and contact the first and second lead-out portions 1210 and 1220, respectively, to thereby be electrically connected thereto.

The third and fourth external electrodes 1430 and 1440 may be formed on the first surface S1 of the ceramic body 1100 so as to be spaced apart from each other in the length direction of the ceramic body and contact the third and fourth lead-out portions 1310 and 1320, respectively, to thereby be electrically connected thereto.

Further, the first internal electrode 1200 may have fifth and sixth lead-out portions 1230 and 1240 spaced apart from each other in the length direction of the ceramic body and exposed to a second main surface S2 of the ceramic body 1100.

In addition, the second internal electrode 1300 may have seventh and eighth lead-out portions 1330 and 1340 exposed to the second surface S2 of the ceramic body 1100 and formed alternately with the fifth and sixth lead-out portions 1230 and 1240 in the length direction so as not to be overlapped with each other.

Further, fifth to eighth external electrodes 1450 to 1480 may be formed on the second surface S2 of the ceramic body 1100 so as to be spaced apart from each other.

In this case, the fifth and sixth external electrodes 1450 and 1460 may contact the fifth and sixth lead-out portions 1230 and 1240, respectively, to thereby be electrically connected thereto, and the seventh and eighth external electrodes 1470 and 1480 may contact the seventh and eighth lead-out portions 1330 and 1340, respectively, to thereby be electrically connected thereto.

In the multilayer ceramic capacitor 1000 according to the exemplary embodiment in the present disclosure configured as described above, an area formed by a current loop may be further decreased, and a current path may be further dispersed, such that ESL of the capacitor may be further decreased by about 50% as compared to the 3-terminal capacitor according to the exemplary embodiment in the present disclosure.

Meanwhile, since a structure of the ceramic body 1100 and a three-layer structure and numerical limitations of the first to eighth external electrodes 1410 to 1480 are similar to those in the foregoing exemplary embodiment of the present disclosure, a detailed description thereof will be omitted.

Experimental Example

Multilayer ceramic capacitors according to Inventive Examples and Comparative Examples were manufactured as follows.

A slurry containing powder such as barium titanate (BaTiO$_3$) powder, or the like, was applied to a carrier film to then be dried thereon, thereby preparing a plurality of ceramic green sheets having a thickness of 1.8 μm.

Then, a conductive paste for an internal electrode was applied to the ceramic green sheet using screen printing, thereby forming first and second internal electrodes 120 and 130.

The first internal electrode 120 may include first and second lead-out portions 121 and 122 exposed to a first surface and fourth and fifth lead-out portions 123 and 124 exposed to a second surface on the ceramic green sheet.

The second internal electrode 130 may include a third lead-out portion 131 exposed to the first surface and a sixth lead-out portion 132 exposed to the second surface on the ceramic green sheet.

The third lead-out portion 131 was formed to be spaced apart from the first and second lead-out portions 121 and 122, and the sixth lead-out portion 132 was formed to be spaced apart from the fourth and fifth lead-out portions 123 and 124.

Then, the plurality of ceramic green sheets were stacked so that the first and second internal electrodes 120 and 130 were alternately disposed.

Thereafter, on both sides of the stacked first and second internal electrodes, at least one or more ceramic green sheets on which the first and second internal electrodes 120 and 130 were not formed were stacked, respectively, to form cover layers 112 and 113, thereby manufacturing a multilayer body.

Then, the isostatic pressing was performed on the multilayer body at about 85° C. and a pressure of about 1000 kgf/cm$^2$.

Next, a ceramic multilayer body subjected to the isostatic pressing was cut into regions to have the form of individual chips.

Then, the cut chip was subjected to a de-binding process to be maintained at about 230° C. for about 60 hours under an air atmosphere.

Next, a ceramic body was prepared by sintering the chip at about 1200° C. under a reduction atmosphere having an oxygen partial pressure of $10^{-11}$ atm to $10^{-10}$ atm lower than Ni/NiO equilibrium oxygen partial pressure so that the internal electrode was not oxidized.

A chip size of the multilayer chip capacitor after sintering was about 2.0 mm×1.25 mm (Length×Width (L×W), so-called 2012 size). In this case, a manufacturing tolerance was in a range of ±0.1 mm (Length×Width (L×W)).

Then, a process of forming first to sixth external electrodes 141 to 146 on first and second surfaces S1 and S2 of a ceramic body 110 so as to be connected to the corresponding lead-out portions of the first and second internal electrodes 120 and 130, respectively, was performed.

The multilayer ceramic capacitor was completed through the above-mentioned processes and whether or not a defect due to a high temperature/moisture resistance load occurred and whether or not a size defect occurred were tested. The test results were shown in Table 1.

Here, a high temperature load test was performed at 85° C. and 1.25× rated voltage, and a moisture resistance load test was performed at 85° C., a humidity of 85%, and 1× rated voltage.

In this case, the high temperature/moisture resistance load test was performed on 800 test samples under the same test conditions, and the size defect test was performed on 100 test samples under the same test conditions. Here, the size defect indicates a defect in which, since a thickness of the external electrode is excessively thick, the entire chip size is outside of the range of the specification.

In addition, b/c, a ratio of the thickness b of the conductive layer directly connected to the internal electrode to the thickness c of the nickel plating layer may satisfy $0.930 \leq b/c \leq 5.391$.

Referring to Table 1, in the cases of samples 1 and in which $(b-b_p)/a$ was less than 0.264, a high temperature/moisture resistance load defect occurred, and in the case of samples 15 and 16 in which $(b-b_p)/a$ was more than 0.638, the thickness of the external electrodes was excessively thick, such that a size defect in which the chip size was outside of the range of the specification occurred.

Therefore, $(b-b_p)/a$ may be 0.264 or more, but 0.638 or less.

Further, in the cases of the samples 1 and 2 in which b/c was less than 0.930, since the thickness b of the conductive layer was excessively thin, at the time of performing nickel plating, infiltration of the plating solution was not blocked, such that the high temperature/moisture resistance load

TABLE 1

| No  | a       | b        | $b_p$    | c       | $(b - b_p)/a$ | b/c   | High Temperature/ Moisture Resistance Load Defect | Size Defect |
|-----|---------|----------|----------|---------|---------------|-------|---------------------------------------------------|-------------|
| 1*  | 11.1 um | 2.7 um   | 0.55 um  | 4.40 um | 0.194         | 0.614 | 12/800                                            | 0/100       |
| 2*  | 13.9 um | 3.2 um   | 0.33 um  | 5.20 um | 0.206         | 0.615 | 9/800                                             | 0/100       |
| 3   | 16.0 um | 5.3 um   | 1.08 um  | 5.70 um | 0.264         | 0.930 | 0/800                                             | 0/100       |
| 4   | 14.6 um | 5.8 um   | 0.62 um  | 4.40 um | 0.355         | 1.318 | 0/800                                             | 0/100       |
| 5   | 14.8 um | 7.9 um   | 1.48 um  | 3.80 um | 0.434         | 2.079 | 0/800                                             | 0/100       |
| 6   | 19.6 um | 8.2 um   | 1.04 um  | 5.50 um | 0.365         | 1.491 | 0/800                                             | 0/100       |
| 7   | 22.7 um | 11.2 um  | 1.87 um  | 5.50 um | 0.411         | 2.036 | 0/800                                             | 0/100       |
| 8   | 20.6 um | 11.8 um  | 1.33 um  | 4.80 um | 0.508         | 2.458 | 0/800                                             | 0/100       |
| 9   | 23.0 um | 13.5 um  | 2.02 um  | 4.40 um | 0.499         | 3.068 | 0/800                                             | 0/100       |
| 10  | 22.4 um | 14.0 um  | 1.29 um  | 4.60 um | 0.567         | 3.043 | 0/800                                             | 0/100       |
| 11  | 28.9 um | 18.0 um  | 3.10 um  | 5.30 um | 0.516         | 3.396 | 0/800                                             | 0/100       |
| 12  | 25.6 um | 17.5 um  | 2.42 um  | 4.00 um | 0.589         | 4.375 | 0/800                                             | 0/100       |
| 13  | 34.4 um | 24.0 um  | 4.24 um  | 5.60 um | 0.574         | 4.286 | 0/800                                             | 0/100       |
| 14  | 34.1 um | 24.8 um  | 3.05 um  | 4.60 um | 0.638         | 5.391 | 0/800                                             | 0/100       |
| 15* | 43.1 um | 34.2 um  | 6.14 um  | 5.20 um | 0.651         | 6.577 | 0/800                                             | 7/100       |
| 16* | 43.9 um | 34.8 um  | 3.18 um  | 5.60 um | 0.720         | 6.214 | 0/800                                             | 9/100       |

Referring to FIG. 5, an outermost portion of the first lead-out portion 121 exposed to the first surface S1 of the ceramic body 110 may be defined as P, a total thickness of the first conductive layer 141a, the first nickel plating layer 141b, and the first tin plating layer 141c in a normal line direction of the first conductive layer 141a from P may be defined as a, a thickness of the first conductive layer 141a in the normal line direction of the first conductive layer 141a from P may be defined as b, and a thickness of the first nickel plating layer 141b in the normal line direction of the first conductive layer 141a from P may be defined as c.

Here, the normal line L1 refers to a straight line which passes through P and is perpendicular to a tangent plane T1 at a point on a curved line forming a boundary surface between the conductive layer and the nickel plating layer.

In addition, a sum of pore heights $b_{p1}$ and $b_{p2}$ of pores existing in the first conductive layer in the normal line direction of the first conductive layer from P may be defined as $b_p$.

In the exemplary embodiment the present disclosure, $(b-b_p)/a$, which is a ratio of a real thickness $(b-b_p,$ a thickness of only a metal portion) except for thickness $b_p$ of the pores from the thickness b of the conductive layer directly connected to the internal electrode to the thickness a of the entire external electrode, may satisfy $0.264 \leq (b-b_p)/a \leq 0.638$.

defect occurred, and in the cases of the samples 15 and 16 in which b/c was more than 5.391, the thickness of the external electrode was excessively thick, such that the size defect in which the chip size was outside of the range of the specification occurred.

Meanwhile, the results shown in Table 1 may be similarly applied to the first to third external electrodes of the multilayer ceramic capacitors according to the exemplary embodiments shown in FIGS. 1 and 6.

Board Having Multilayer Ceramic Capacitor

Figure 16:
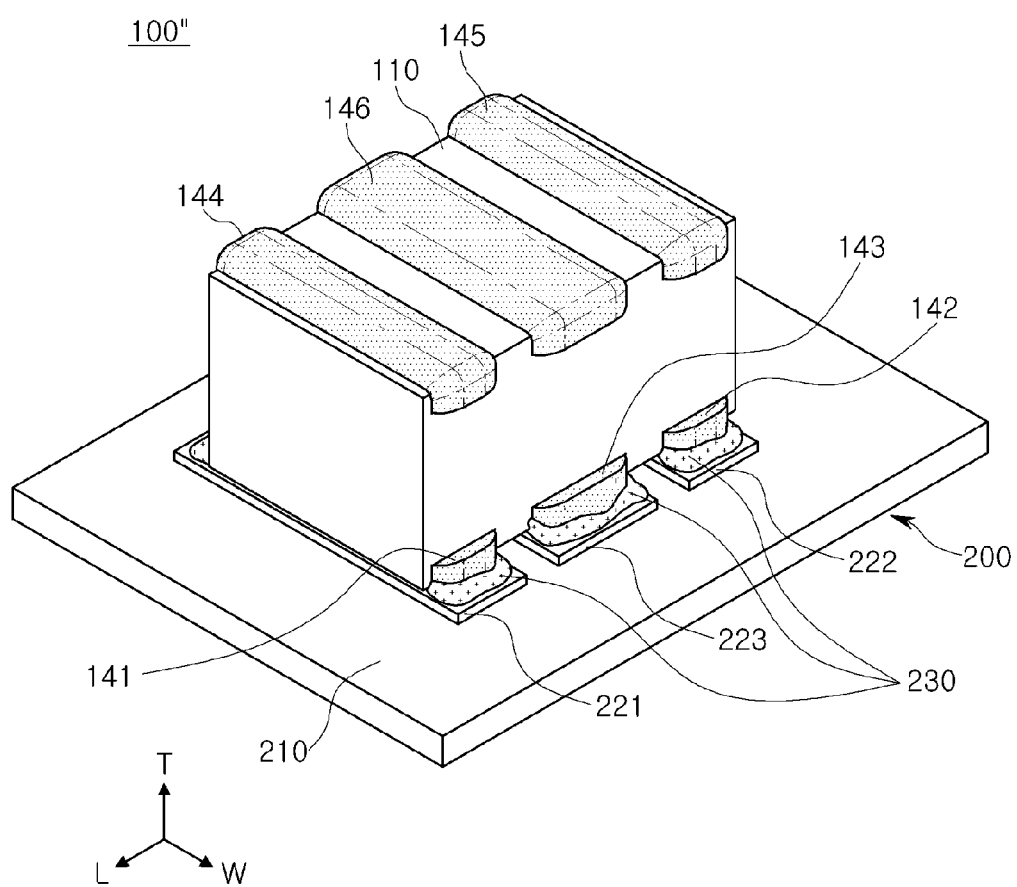
FIG. 16 is a perspective view illustrating a form in which the multilayer ceramic capacitor of FIG. 9 is mounted on a substrate.
Figure 17:
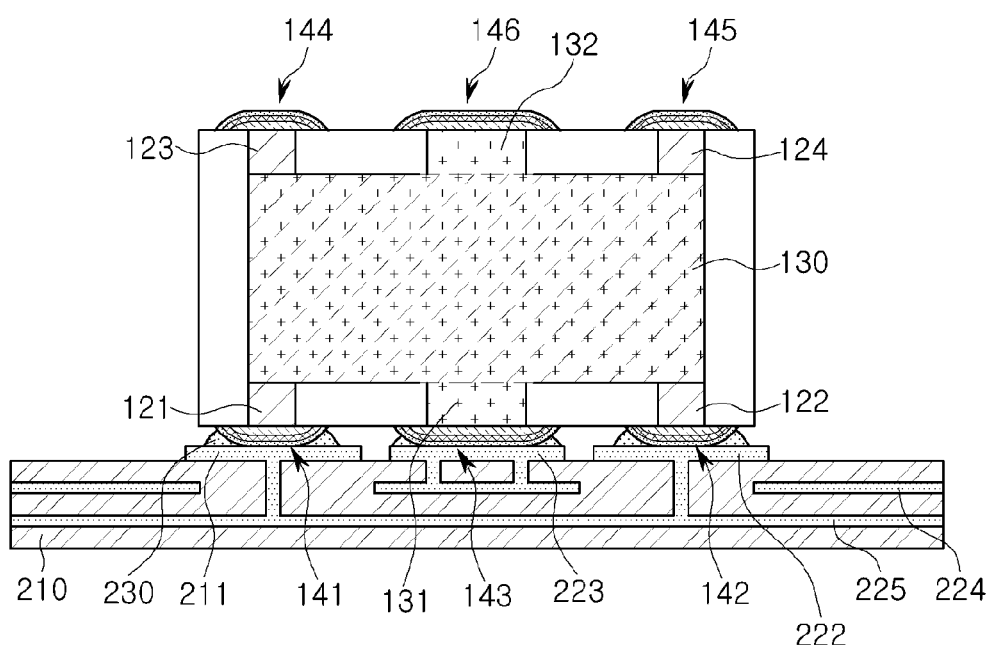
FIG. 17 is a cross-sectional view illustrating the form in which the multilayer ceramic capacitor of FIG. 9 is mounted on the substrate.

FIG. 16 is a perspective view illustrating a form in which the multilayer ceramic capacitor of FIG. 9 is mounted on a substrate, and FIG. 17 is a cross-sectional view illustrating the form in which the multilayer ceramic capacitor of FIG. 9 is mounted on the substrate.

Referring to FIGS. 16 and 17, a board 200 having a multilayer ceramic capacitor 100" according to the present exemplary embodiment may include a substrate 210 on which the multilayer ceramic capacitor 100" is mounted, and first to third electrode pads 221 to 223 formed on the substrate 210 so as to be spaced apart from each other.

In this case, the multilayer ceramic capacitor 100" may be adhered to the substrate 210 by a solder 230 to thereby be electrically connected to each other in a state in which first to third external electrodes 141 to 143 are positioned on the first to third electrode pads 221 to 223, respectively, so as to contact each other.

In FIG. 17, reference numeral 224 indicates a ground terminal, and reference numeral 225 indicates a power terminal.

Meanwhile, although the case in which the multilayer ceramic capacitor of FIG. 9 is mounted is described in the present exemplary embodiment, the present disclosure is not limited thereto. For example, the multilayer ceramic capacitors illustrated in FIGS. 1 and 6 may also be mounted on a substrate in a manner similar thereto to thereby configure boards including a multilayer ceramic capacitor.

Further, the electrode pads included in the board according to the present disclosure may be changed according to the structure of the multilayer ceramic capacitor to be mounted. For example, in the case of a board on which a multilayer ceramic capacitor having a 4-terminal structure is mounted, the board may include four electrode pads formed thereon. Therefore, a structure of the board having a multilayer ceramic capacitor according to the present disclosure is not limited to those of the drawings.

As set forth above, according to exemplary embodiments in the present disclosure, since the lead-out portion of the internal electrode is positioned on the mounting surface, the area of the current loop may be decreased, such that ESL may be decreased, and infiltration of a plating solution through an external electrode may be prevented, thereby preventing reliability from being deteriorated.

While exemplary embodiments have been shown and described above, it will be apparent to those skilled in the art that modifications and variations could be made without departing from the scope of the present disclosure as defined by the appended claims.

What is claimed is:

1. A multilayer ceramic capacitor comprising:
   internal electrodes having opposing polarities when in operation, alternately disposed in a ceramic body, and having lead-out portions exposed to a mounting surface of the ceramic body and spaced apart from each other in a length direction of the ceramic body; and
   external electrodes electrically connected to the lead-out portions having opposing polarities, respectively, and each including a conductive layer, a nickel (Ni) plating layer, and a tin (Sn) plating layer sequentially layered from the mounting surface of the ceramic body,
   wherein in one of the external electrodes:
      the conductive layer includes one or more first pores in a first normal line, wherein the first normal line connects a first outermost portion P1 of one of the lead-out portions exposed to the mounting surface of the ceramic body and covered by the one of the external electrodes and a first point on a first curved line forming a first boundary surface between the conductive layer and the nickel (Ni) plating layer, and wherein the first normal line passes through the one or more first pores and is perpendicular to a first tangent plane at the first point on the first curved line, and
   $(b-b_p)/a$ satisfies the following:

$$0.264 \leq (b-b_p)/a \leq 0.638,$$

in which:
      a is a total thickness of the conductive layer, the nickel plating layer, and the tin plating layer in the first normal line of the conductive layer from P1,
      b is a thickness of the conductive layer in the first normal line of the conductive layer from P1, and
      $b_{yp}$ is a sum of heights of the one or more first pores existing in the conductive layer in the normal line of the conductive layer from P1, and
   wherein in the one of the external electrodes, b/c satisfies $0.930 \leq b/c \leq 5.391$, in which c is a thickness of the nickel plating layer in the first normal line of the conductive layer from P1.

2. The multilayer ceramic capacitor of claim 1, wherein the internal electrodes are spaced apart from both end surfaces of the ceramic body in the length direction.

3. The multilayer ceramic capacitor of claim 1, wherein the external electrodes extend to portions of both side surfaces of the ceramic body in a width direction of the ceramic body.

4. The multilayer ceramic capacitor of claim 1, wherein the internal electrodes include a plurality of first and second internal electrodes alternately disposed with a dielectric layer interposed between the plurality of first and second internal electrodes to form an active layer, each of the first internal electrodes having first and second lead-out portions extend to be exposed to the mounting surface of the ceramic body and are spaced apart from each other in the length direction of the ceramic body, and each of the second internal electrodes having a third lead-out portion extends to be exposed to the mounting surface of the ceramic body and is disposed between the first and second lead-out portions,
   the external electrodes include first and second external electrodes on the mounting surface of the ceramic body, spaced apart from each other in the length direction of the ceramic body and electrically connected to the first and second lead-out portions, respectively, and a third external electrode between the first and second external electrodes and electrically connected to the third lead-out portion, and
   the first to third external electrodes include the conductive layers, the nickel plating layers, and the tin plating layers sequentially layered from mounting surface of the ceramic body.

5. The multilayer ceramic capacitor of claim 4, wherein each of the first internal electrodes further has fourth and fifth lead-out portions that extend to be exposed to the opposing surface from the mounting surface of the ceramic body and are spaced apart from each other in the length direction of the ceramic body,
   each of the second internal electrodes further has a sixth lead-out portion that extends to be exposed to the opposing surface from the mounting surface of the ceramic body and is disposed between the fourth and fifth lead-out portions, and
   an insulating layer is disposed on the opposing surface from the mounting surface of the ceramic body.

6. The multilayer ceramic capacitor of claim 4, wherein each of the first internal electrodes further has fourth and fifth lead-out portions that extend to be exposed to the opposing surface from the mounting surface of the ceramic body and spaced apart from each other in the length direction of the ceramic body,
   each of the second internal electrodes further has a sixth lead-out portion that extend to be exposed to the opposing surface from the mounting surface of the ceramic body and disposed between the fourth and fifth lead-out portions, and
   the external electrodes further include fourth and fifth external electrodes disposed on the opposing surface from the mounting surface of the ceramic body, spaced apart from each other in the length direction of the ceramic body and electrically connected to the fourth and fifth lead-out portions, respectively, and a sixth external electrode between the fourth and fifth external electrodes and electrically connected to the sixth lead-out portion.

7. The multilayer ceramic capacitor of claim 6, wherein the fourth to sixth external electrodes each include a conductive layer a nickel (Ni) plating layer, and a tin (Sn) plating layer sequentially layered from the opposing surface from the mounting surface of the ceramic body, and
wherein in one of the fourth to sixth external electrodes:
the conductive layer includes one or more second pores in a second normal line, wherein the second normal line connects a second outermost portion P2 of one of the fourth to sixth lead-out portions exposed to the opposing surface from the mounting surface of the ceramic body and covered by the one of the fourth to sixth external electrodes and a second point on a second curved line forming a second boundary surface between the conductive layer and the nickel (Ni) plating layer, and the second normal line passes through the one or more second pores and is perpendicular to a second tangent plane at the second point on the second curved line, and $(b_1-b_{p1})/a_1$ satisfies $0.264 \leq (b_1-b_{p1})/a_1 \leq 0.638$, wherein:
$a_1$ is a total thickness of the conductive layer, the nickel plating layer, and the tin plating layer in the second normal line of the conductive layer from P2,
$b_1$ is a thickness of the conductive layer in the second normal line of the conductive layer from P2, and
$b_{p1}$ is a sum of heights of the one or more second pores existing in the conductive layer in the second normal line of the conductive layer from P2.

8. The multilayer ceramic capacitor of claim 7, wherein, in the one of the fourth to sixth external electrodes, $b_1/c_1$ satisfies $0.930 \leq b_1 k_1 \leq 5.391$, in which $c_1$ is a thickness of the nickel plating layer in the second normal line of the conductive layer from P2.

9. The multilayer ceramic capacitor of claim 6, wherein the fourth to sixth external electrodes extend to portions of both side surfaces of the ceramic body in a width direction of the ceramic body, respectively.

10. The multilayer ceramic capacitor of claim 1, further comprising cover layers disposed on both side surfaces of an active layer including a plurality of internal electrodes in a width direction of the ceramic body.

11. A board having a multilayer ceramic capacitor comprising:
a substrate on which a plurality of electrode pads are disposed; and
the multilayer ceramic capacitor of claim 1,
wherein the plurality of electrode pads of the substrate are provided with external electrodes disposed on the plurality of electrode pads, respectively.

12. A multilayer ceramic capacitor comprising:
a ceramic body including a plurality of dielectric layers layered in the ceramic body in a width direction of the ceramic body and having first and second surfaces opposing each other in a thickness direction of the ceramic body, fifth and sixth surfaces opposing each other in the width direction, and third and fourth surfaces opposing each other in a length direction of the ceramic body;
an active layer including a plurality of first and second internal electrodes alternately formed with the respective dielectric layers interposed between the plurality of first and second internal electrodes in the ceramic body, each of the first internal electrodes having first and second lead-out portions spaced apart from each other in the length direction and exposed to the first surface of the ceramic body, and being spaced apart from the third and fourth surfaces, and each of the second internal electrodes having third and fourth lead-out portions exposed to the first surface of the ceramic body and disposed to alternate with the first and second lead-out portions, and being spaced apart from third and fourth surfaces;
cover layers disposed on both side surfaces of the active layer;
first and second external electrodes disposed on the first surface of the ceramic body to be spaced apart from each other in the length direction and electrically connected to the first and second lead-out portions, respectively; and
third and fourth external electrodes on the first surface of the ceramic body, spaced apart from each other in the length direction and electrically connected to the third and fourth lead-out portions, respectively,
wherein the first to fourth external electrodes each include a conductive layer, a nickel (Ni) plating layer, and a tin (Sn) plating layer sequentially layered from the first surface of the ceramic body,
wherein in one of the first to fourth external electrodes:
the conductive layer includes one or more first pores in a first normal line, wherein the first normal line connects a first outermost portion P1 of one of the first to fourth sixth lead-out portions exposed to the first surface of the ceramic body and covered by the one of the first to fourth external electrodes and a first point on a first curved line forming a first boundary surface between the conductive layer and the nickel (Ni) plating layer, and wherein the first normal line passes through the one or more first pores and is perpendicular to a first tangent plane at the first point on the first curved line, and $(b-b_p)/a$ satisfies $0.264 \leq (b-b_p)/a \leq 0.638$, in which:
a is a sum of thicknesses of the conductive layer, the nickel plating layer, and the tin plating layer in the first normal line of the conductive layer from P1,
b is a thickness of the conductive layer in the first normal line of the conductive layer from P1, and
$b_p$ is a sum of heights of the one or more first pores existing in the conductive layer in the first normal line of the conductive layer from P1, and
wherein in the one of the first to fourth external electrodes, b/c satisfies $0.930 \leq b/c \leq 5.391$, in which c is a thickness of the nickel plating layer in the first normal line of the conductive layer from P1.

13. The multilayer ceramic capacitor of claim 12, wherein each of the first internal electrodes has fifth and sixth lead-out portions spaced apart from each other in the length direction and exposed to the second surface of the ceramic body, and
each of the second internal electrodes has seventh and eighth lead-out portions exposed to the second surface of the ceramic body and disposed to alternate with the fifth and sixth lead-out portions,
the multilayer ceramic capacitor further comprising:
fifth and sixth external electrodes on the second surface of the ceramic body, spaced apart from each other in the length direction and electrically connected to the fifth and sixth lead-out portions, respectively; and seventh and eighth external electrodes on the second surface of the ceramic body, spaced apart from each other in the length direction and electrically connected to the seventh and eighth lead-out portions, respectively.

14. The multilayer ceramic capacitor of claim 13, wherein the fifth to eighth external electrodes each include a conductive layer, the nickel (Ni) plating layer, and the tin (Sn) plating layer sequentially layered from the second surface of the ceramic body, and wherein in one of the fifth to eighth external electrodes:
the conductive layer includes one or more second pores in a second normal line, wherein the second normal line connects a second outermost portion P2 of one of the fifth to eighth lead-out portions exposed to the second surface of the ceramic body and covered by the one of the fifth to eighth external electrodes and a second point on a second curved line forming a second boundary surface between the conductive layer and the nickel (Ni) plating layer, and wherein the second normal line passes through the one or more second pores and is perpendicular to a second tangent plane at the second point on the second curved line, and $(b_1-b_{p1})/a_1$ satisfies $0.264 \leq (b_1-b_{p1})/a_1 \leq 0.638$, in which:
$a_1$ is a sum of thicknesses of the conductive layer, the nickel plating layer, and the tin plating layer in the second normal line of the conductive layer from P2, $b_1$ is a thickness of the conductive layer in the second normal line of the conductive layer from P2, and $b_{p1}$ is a sum of heights of the one or more second pores existing in the conductive layer in the normal line of the conductive layer from P2.

15. The multilayer ceramic capacitor of claim 14, wherein in the one of the fifth to eighth external electrodes, $b_1/c_1$ satisfies $0.930 \leq b_1/c_1 \leq 5.391$, in which $c_1$ is a thickness of the nickel plating layer in the normal line of the conductive layer from P2.

16. A board having a multilayer ceramic capacitor comprising:
a substrate on which a plurality of electrode pads are disposed; and
the multilayer ceramic capacitor of claim 12, wherein the plurality of electrode pads of the substrate are provided with external electrodes disposed on the plurality of electrode pads, respectively.

17. A multilayer ceramic capacitor comprising:
internal electrodes having opposing polarities when in operation, alternately disposed in a ceramic body in a width direction of the ceramic body, and having lead-out portions exposed to a mounting surface of the ceramic body and spaced apart from each other in a length direction of the ceramic body; and external electrodes electrically connected to the lead-out portions having opposing polarities, respectively, and each including a conductive layer and plating layers sequentially layered from the mounting surface of the ceramic body, wherein in one of the external electrodes:
the conductive layer includes one or more pores in a normal line, wherein the normal line connects an outermost portion P of one of the lead-out portions exposed to the mounting surface of the ceramic body and covered by the one of the external electrodes and a point on a curved line forming a boundary surface between the conductive layer and the plating layers, and wherein the normal line passes through the one or more pores and is perpendicular to a tangent plane at the point on the curved line, and $(b-b_p)/a$ satisfies the following:

$0.264 \leq (b-b_p)/a \leq 0.638$ in which:
a is a total thickness of the conductive layer and the plating layers in the normal line of the conductive layers from P, b is a thickness of the conductive layer in the normal line of the conductive layer from P, and $b_p$ is a sum of heights of the one or more pores existing in the conductive layer in the normal line of the conductive layer from P, and wherein in the one of the external electrodes, b/c satisfies $0.930 \leq b/c \leq 5.391$, in which c is a thickness of a nickel (Ni) plating layer of the plating layers in the normal line of the conductive layer from P.

18. The multilayer ceramic capacitor of claim 17, wherein the plating layers comprise the nickel (Ni) plating layer and a tin (Sn) plating layer, and the internal electrodes are spaced apart from opposite end surfaces of the ceramic body in the length direction.

* * * * *